United States Patent [19]

Troxell

[11] Patent Number: 4,571,348
[45] Date of Patent: Feb. 18, 1986

[54] REDUCING HYDROGEN CONTENT OF VACUUM DEPOSITED FILMS

[75] Inventor: John R. Troxell, Sterling Heights, Mich.

[73] Assignee: General Motors Corporation, Detroit, Mich.

[21] Appl. No.: 638,906

[22] Filed: Aug. 8, 1984

[51] Int. Cl.$^4$ .......................................... H01L 21/302
[52] U.S. Cl. ....................................... 427/38; 427/86; 204/192 N; 250/492.2; 250/492.3
[58] Field of Search .............. 204/192 N; 427/38, 94, 427/95, 397.7, 35, 86; 250/492.3, 492.2

[56] References Cited

U.S. PATENT DOCUMENTS

| | | | |
|---|---|---|---|
| 4,133,704 | 1/1979 | Mac Iver et al. | 148/1.5 |
| 4,243,433 | 1/1981 | Gibbons | 148/1.5 |
| 4,321,317 | 3/1982 | Mac Iver | 430/5 |
| 4,379,727 | 4/1983 | Hansen et al. | 148/1.5 |
| 4,410,611 | 10/1983 | Mac Iver | 430/5 |
| 4,466,839 | 8/1984 | Dathe et al. | 148/1.5 |

OTHER PUBLICATIONS

Reif et al., "Low Temperature Process to Increase the Grain Size in Polysilicon Films", *Electronics Letters*, Aug. 20, 1981, vol. 17, No. 17, pp. 586–588.
Amano et al., "A Novel Three-Step Process for Low-Defect-Density Silicon on Sapphire," *Appl. Phys. Lett.*, 39(2), Jul. 15, 1981, pp. 163–165.
J. A. Mc Millan and E. M. Peterson, "Kinetics of Decomposition of Amorphous Hydrogenated Silicon Films", *J. Appl. Physics.*, v. 50, No. 8, pp. 5238–5241 (Aug. 1979).

*Primary Examiner*—Norman Morgenstern
*Assistant Examiner*—Kenneth Jaconetty
*Attorney, Agent, or Firm*—Robert J. Wallace

[57] ABSTRACT

A method of treating thin films containing a significant atomic proportion of hydrogen to enable such films to be subjected to elevated temperatures without blistering. The films are subjected to a significant, i.e. damaging, high implantation prior to heat treatment.

2 Claims, No Drawings

REDUCING HYDROGEN CONTENT OF VACUUM DEPOSITED FILMS

FIELD OF THE INVENTION

This invention relates to preparing thin films of predetermined hydrogen content. More specifically, it involves a technique for reducing hydrogen content in thin films, particularly silicon and silicon nitride films, produced by plasma enhanced chemical vapor deposition at low temperatures.

BACKGROUND OF THE INVENTION

Some thin films useful in the manufacture of semiconductor devices may include significant amounts of hydrogen either by choice or by the inherent result of the method of film formation. For example, one may choose to include hydrogen in a silicon film to reduce carrier trapping at dangling bonds or grain boundaries, effective to provide a higher carrier mobility. Further, plasma enhanced chemical vapor deposition from silane ($SiH_4$) inherently produces silicon and silicon nitride films that include a significant amount of hydrogen. This is particularly true if the deposition is performed below about 400° C. In this latter connection, it should be recognized that plasma enhanced chemical vapor deposition is a very useful process for forming films on substrates that cannot be subjected to extremely high temperatures, as for example glass. One application might be a multiplexed liquid crystal display module in which a glass plate forming part of the liquid crystal display also supports one or more islands of silicon in which semiconductive devices controlling the display are formed.

When forming semiconductive devices in a plasma enhanced chemical vapor deposited silicon layer formed at 300°–400° C., a significant proportion, i.e. about 10–30 atomic percent, of hydrogen will be included in the coating. It is to be noted that the precise proportion of hydrogen in the layer is one of the factors that determines the precise characterictics of the resultant semiconductive devices formed in that layer. On the other hand, it is extremely difficult to control deposition processes such as plasma enhanced chemical vapor deposition accurately enough to obtain a precisely predetermined hydrogen content in the resultant film. Where such a precise predetermined hydrogen content is desired, it can be obtained by producing more hydrogen in the film than is eventually desired, measuring the actual resultant hydrogen content, and then annealing, i.e. heat treating, the film to out-diffuse the hydrogen down to the desired predetermined level. Annealing can also be used merely to reduce hydrogen content to some low level significantly below the deposition level, if the deposition level is inherently too high for some reason. In fact, annealing can be used to remove substantially all the hydrogen, when no appreciable hydrogen content is desired.

The use of annealing to out-diffuse an undesired component is, of course, not new. On the other hand, when thin films containing significant proportions of hydrogen are heat treated, even at relatively moderate temperatures, hydrogen evolution occurs disruptively. Hydrogen gathers at localized sites in and under the film, forming bubbles that blister the film. Blistering is so extensive in films containing more than about 15 to 20 atomic percent hydrogen that films are no longer useful for most intended applications. For example, a satisfactory semiconductive device cannot be formed in a blistered area of film. If the heating is more rapid and/or the temperatures higher, an even lower amount of atomic hydrogen, as for example about 10 atomic percent, can produce damaging blistering also.

It should also be recognized that in some cases, the hydrogen inherently included in the film due to the deposition may be a problem primarily because the film is inherently subjected to a heating step later on. If disruptive hydrogen evolution occurs, and if the film is a passivating or sealing coating, its protection is at least deleteriously affected, if not entirely lost.

I have found that if such films are given a significant ion implantation before they are heated, disruptive hydrogen evolution, that is, blistering, does not occur. Accordingly, hydrogen content of hydrogen-containing films can be precisely adjusted down to any desired level by annealing without damaging them. Why this occurs is not understood. On the other hand, experimental evidence indicates that ions implanted in a sufficient dosage and depth may serve to activate atoms in the film. This may enhance atomic or molecular out-diffusion of hydrogen from the film, so that it occurs more uniformly across the film surface. In any event, hydrogen does not accumulate in bubbles that blister the resultant film.

OBJECTIVES AND SUMMARY OF THE INVENTION

It is an object of this invention to provide an improved method for heating high hydrogen containing thin films that are subjected to elevated temperatures.

It is also an object of this invention to provide a method for reducing hydrogen content in thin films without an attendant blistering of the film.

Another object of this invention is to provide a treatment for thin films containing excessive volatile components, that permit the films to be subjected to elevated temperatures without deleterious affects.

Still another object of the invention is to provide a method of precisely predetermining hydrogen content of films produced by plasma enhanced chemical vapor deposition.

In one specific example, my invention comprehends depositing a film of a material such as silicon or silicon nitride by a process which produces a hydrogen content in the resultant film in excess of about 10 atomic percent. The film is then given an ion implantation that damages it at least halfway through its thickness to a degree sufficient to allow hydrogen to be non-deleteriously outgassed. The film is then annealed for a sufficient time and for a sufficient duration to out-diffuse hydrogen from the film down to a predetermined hydrogen content. Because of the ion implantation, which prevents the film from blistering during anneal, hydrogen bubbles do not form in and under the film.

DESCRIPTION OF THE PREFERRED EMBODIMENTS

In this invention, formation of gas bubbles, i.e. blistering, of a high hydrogen content thin film during heating is suppressed by subjecting the film to a significant ion implantation before the heating. I believe that blistering is suppressed because hydrogen gas accumulation, i.e. bubble formation, is suppressed. I think it is suppressed because the ion implantation enhances out-diffusion of hydrogen gas through the film and from its surface prior to anneal. Thus, even though the rate of hydrogen movement in the film as a result of the ion implantation could aggravate the blistering, it does not. Apparently, the hydrogen leaves the surface of the film faster than it can accumulate in a bubble. I believe this occurs because the ion implantation at least strains, i.e. "damages" atomic bonding in the film. I further believe that this adds energy to the hydrogen atoms and enhances diffusion of hydrogen through the film and from the film to the surrounding ambient even before the film is heated. In any event, the blisters do not form when the ion implanted film is heated.

In specific examples of this invention, silicon films were produced by plasma enhanced chemical vapor deposition from silane ($SiH_4$) at about 300°–400° C. The silicon films were deposited onto a face of a Corning 7059 barium borosilicate glass substrate upon which approximately one micrometer of silicon dioxide had been previously deposited. Silicon films having about 10–30 atomic percent hydrogen were produced, with the higher hydrogen contents being formed at the lower temperatures. The silicon films were deposited to thicknesses ranging from 160 nanometers to one micrometer. As deposited, the silicon films were amorphous, as is usual. After deposition, the silicon films were given an implantation with $^{28}Si^+$ at about 170 keV in doses of about $0.5 \times 10^{14}$ silicon ions per square centimeter to $5 \times 10^{16}$ silicon ions per square centimeter at beam currents up to 200 microamperes. Lower beam currents, such as about 50–100 microamperes, seem to be more effective than the higher beam currents, such as about 200–300 microamperes only on the thicker films, such as about one micrometer thick.

The 170 keV energy produced maximum damage to atomic bonding at or below the silicon-silicon dioxide interface on samples where the silicon film was 160 nanometers thick. In such instance the average depth of implantation was equal to or greater than the thickness of the film. The distribution of implanted ions through the thickness of the film is, of course, Gaussian. Thus, even though one targets ion beam energy to provide implantation to a predetermined depth, sometimes referred to as projected range, that depth is only an average of the depth of all the ions implanted above and below the target depth.

Precise characteristics of the ion implantation, that make it a significant ion implantation for purposes of this invention, can vary, because precise characteristics of the films can vary. For example, which ions should be used, how deep the ion implantation should be, what dosage should be used, etc., will vary with the composition and thickness of the film, and perhaps even with the severity of the heating during annealing.

Ordinarily one would want to use an ion for the damaging implant that is metallurgically compatible with the film and its underlying surface. For example, if the film is deposited on glass or silicon dioxide and the film is of silicon or silicon nitride, silicon ions would be metallurgically compatible with such a system. On the other hand, it may be desirable to use argon, a halogen, or nitrogen as the ion species for the implantation.

There is some thought that the implantation should be at an energy that will provide maximum implantation damage at the interface between the film and its underlying surface. By maximum damage I mean the maximum damage to lattice structures, i.e. atomic displacement or interfacial atom mixing. Such damage is typified by vacancies being produced in a crystal lattice or atoms being moved into interstitial positions in a crystal lattice. This action, which occurs from impact of the bombarding ions, transfers momentum to atoms of a material lattice which they hit, permitting the formation of new bonding relationships of higher energy. Maximum ion implantation damage is produced at about 60–80% of the ion implantation projected range.

It may be preferred to target the zone of maximum damage to be at the interface of the film and its underlying surface. On the other hand, I am not sure that this is a requirement in order to simply reduce hydrogen content without blistering during anneal. Tests have shown that if the ion implantation projected range is only halfway through the thickness of the silicon film, hydrogen concentration reduction still takes place. Perhaps the minimum projected range that is needed in terms of the proportion of film thickness, is related to actual film thickness. It may even turn out that for very thin films, such as films thinner than 0.5 micrometer in thickness, that the projected range need only be about one-third of the film thickness. The implantation energy needed to produce the particular projected range that is desired will correspondingly vary. However, in most instances I would probably prefer to use an implantation energy of greater than about 200 keV, especially for silicon films that are of the order of about 0.5 micrometer and thicker. The current limit of commercially available ion implantation equipment is about 200 keV. If higher power ion implantation equipment is available one could of course suppress bubble formation in even thicker silicon films than now possible.

Additionally, it appears that implantation dosages should be considerable. By that I mean at least $1 \times 10^{14}$ silicon ions per square centimeter. When at least about $1 \times 10^{15}$ silicon atoms per square centimeter are used, hydrogen bubble formation, i.e. blistering, is generally suppressed if the heating is not too severe.

The embodiments of the invention in which an exclusive property or privilege is claimed are defined as follows:

1. In a method of rapidly heat treating a plasma enhanced chemical vapor deposited silicon layer to make the silicon layer more suitable for formation of semiconductive devices therein, which layer has been deposited on a glass substrate at temperature below about 400° C., is inherently amorphous as deposited, and contains hydrogen that blisters the layer when the layer is rapidly heated, the improvement in which prior to such rapid heat treatment, silicon ions are implanted into the amorphous silicon layer to an average depth at least one-half the thickness of the amorphous silicon layer, and the silicon ions are implanted in a dosage sufficient to enhance hydrogen diffusion into the layer bulk from the layer lower surface, from the layer bulk to its upper surface, and from the layer upper surface to its ambient, effective to allow subsequent rapid heat treatment of the amorphous silicon layer without concurrently forming hydrogen bubbles that would otherwise form therein and damage the amorphous silicon layer during such rapid heat treatment.

2. The method in accordance with claim 1 in which the amorphous silicon layer is supported on a glass substrate, the ions have a projected range that produces maximum damage near the lower surface of the amorphous silicon layer, the dosage is at least about $0.5 \times 10^{14}$ ions per square centimeter, and the heat treatment is performed to produce a silicon film of predetermined crystallinity and hydrogen content.

* * * * *